United States Patent
Khajehpour (10) Patent No.: US 7,245,187 B2
(45) Date of Patent: Jul. 17, 2007

(54) MULTI-STANDARD AMPLIFIER

(75) Inventor: Javad Khajehpour, Waterloo (CA)

(73) Assignee: Sirific Wireless Corporation, Waterloo, Ontario (CA)

(*) Notice: Subject to any disclaimer, the term of this patent is extended or adjusted under 35 U.S.C. 154(b) by 0 days.

(21) Appl. No.: 10/522,654

(22) PCT Filed: Jul. 24, 2003

(86) PCT No.: PCT/CA03/01066

§ 371 (c)(1),
(2), (4) Date: Aug. 25, 2005

(87) PCT Pub. No.: WO2004/010576

PCT Pub. Date: Jan. 29, 2004

(65) Prior Publication Data

US 2006/0055445 A1 Mar. 16, 2006

(51) Int. Cl.
*H03F 3/04* (2006.01)
(52) U.S. Cl. .......................... 330/305; 330/253
(58) Field of Classification Search ............. 330/305, 330/306, 307, 253, 261
See application file for complete search history.

(56) References Cited

U.S. PATENT DOCUMENTS

| | | | |
|---|---|---|---|
| 5,625,318 A | 4/1997 | Sevenhans et al. | |
| 5,673,003 A * | 9/1997 | Zocher | 330/305 |
| 5,774,017 A | 6/1998 | Adar | |
| 5,995,814 A | 11/1999 | Yeh | |
| 6,128,508 A | 10/2000 | Francisco et al. | |
| 6,134,427 A | 10/2000 | Hughes | |
| 6,181,206 B1 | 1/2001 | Palmisano et al. | |
| 6,184,751 B1 | 2/2001 | Siomkos et al. | |
| 6,242,986 B1 | 6/2001 | Adar | |
| 6,259,323 B1 | 7/2001 | Salminen | |
| 6,424,222 B1 | 7/2002 | Jeong et al. | |
| 6,438,358 B1 | 8/2002 | Higuchi | |
| 6,489,838 B1 | 12/2002 | Tsinker | |

(Continued)

OTHER PUBLICATIONS

Samavati et al., "A 12.4mW CMOS Front-End for a 5GHz Wireless-LAN Receiver", *Centre for Integrated Systems*, Stanford University, pp. 1-4.
Zito, "High Image Rejection Fully Integrated RF Receiver Front-End for Wireless Applications", *Dept. Information Engineering, University of Piza*, Italy, 2002, pp. 1-3.

(Continued)

*Primary Examiner*—Henry Choe
(74) *Attorney, Agent, or Firm*—Shin Hung; Borden Ladner Gervais LLP (57) ABSTRACT

The present invention relates generally to amplifiers, and more specifically to multi-band and/or multi-standard low noise amplifiers. There are currently no inexpensive, high-performance, fully-integrable, multi-standard low noise amplifiers (LNAs) available. The invention provides a suitable LNA for a multi-band and/or multi-standard receiver in wireless and other applications. This LNA comprises a positive signal amplifier having a first input for receiving a positive RF signal, and a first output for providing an amplified positive RF signal; a negative signal amplifier having a second input for receiving a negative RF signal, and a second output for providing an amplified negative RF signal; and a tunable differential filter having a tuning control input, a third input for said first output and a fourth input for said second output; the frequency response of said tunable differential filter varying with a control signal input to said tuning control input, whereby signal of undesired frequencies may be filtered from said first output and said second output.

17 Claims, 4 Drawing Sheets

U.S. PATENT DOCUMENTS

| | | | |
|---|---|---|---|
| 6,501,331 | B2 | 12/2002 | Adar |
| 6,509,799 | B1 | 1/2003 | Franca-Neto |
| 6,539,216 | B1 | 3/2003 | Oh et al. |
| 6,556,085 | B2 | 4/2003 | Kwon et al. |
| 6,587,673 | B2 | 7/2003 | Higuchi |
| 6,600,373 | B1 * | 7/2003 | Bailey et al. ............... 330/260 |
| 6,771,124 | B1 * | 8/2004 | Ezell .......................... 330/129 |
| 2002/0190796 | A1 | 12/2002 | Park et al. |
| 2003/0030495 | A1 | 2/2003 | Franca-Neto |
| 2003/0054779 | A1 | 3/2003 | Losser et al. |
| 2004/0058050 | A1 | 3/2004 | Guo |
| 2004/0246051 | A1 | 12/2004 | Hsu et al. |

OTHER PUBLICATIONS

Piazza et al., "A 1.57-GHz Front-End for Triple Conversion GPS Receiver", *IEEE Journal of Solid-State Circuits*, vol. 33, No. 2, Feb. 1998, pp. 202-209.

Li et al., "Design Techniques for Automatically Tuned Integrated Gigahertz-Range Active LC Filters", *IEEE Journal of Solid-State Circuits*, vol. 37, No. 8, Aug. 2002, pp. 967-977.

Philips, "High IP3 MMIC LNA at 1.8-2.4 GHz", pp. 1-6.

Furth, et al., "A 500-nW Floating-Gate Amplifier with Programmable Gain", pp. 1-4.

Maxim, "Designing with the MAX2648 5GHz LNA for High-Frequency Stability", wysiwyg://20/http://www.maxim-ic.com/appnotes.cfm/appnote_number/1756/ln/en, Sep. 27, 2002, pp. 1-5.

Rosu, "LNA Design", http://www.qsl.net/va3iul/, pp. 1-7.

Lucek, et al., "Designing an LNA for a CDMA Front End", www.rfdesign.com, Feb. 1999, pp. 1-6.

RF Micro Devices, "A Quick Guide to Tank Circuits", *RF Micro Devices, Inc.*, 1997-2002, pp. 15-17 to 15-20.

SR560TechNote, "About Noise Figure Contours", http://www.srys.com/html/body_sr560technote.html, 2000, pp. 1-2.

* cited by examiner

FIGURE 1

PRIOR ART

MULTI-STANDARD AMPLIFIER

CROSS REFERENCE TO RELATED APPLICATIONS

This application is a 371 of PCT/CA03/01066 Jul. 24, 2003

The present invention relates generally to amplifiers, and more specifically to multi-band and/or multi-standard low noise amplifiers. The preferred embodiment of the invention satisfies the need for an inexpensive, high-performance, fully-integrable, multi-standard low noise amplifier suitable for wireless applications.

BACKGROUND OF THE INVENTION

There are many different wireless communication systems used world-wide today, including cellular telephone systems, satellite communications, cordless telephones, short range citizen's band (CB) radio and high frequency (HF) radio systems. The communication bands and standards for many of these systems vary between applications and from for one jurisdiction to the next.

One area of particular interest in wireless communications is that of cellular telephone systems. The cellular telephone industry has been experiencing massive growth in both industrial and non-industrial countries alike. But still, a cellular telephone system in one jurisdiction may have been designed around completely different transmission frequencies and operating modes, than a cellular telephone system in another jurisdiction. Portable cellular telephones are therefore often unable to move from one jurisdiction to another.

It would be desirable to have a cellular telephone which could operate in any jurisdiction, thus being portable worldwide. However, the standards for cellular telephone technology vary a great deal. Some of the major standards are:

1. the advanced mobile phone service ("AMPS") used in North America. This is an analog cellular system which uses a transmission frequency band between 824 MHz and 849 MHz. This band is often referred to as AMPS 800;
2. the digital mobile phone service ("DMPS"), which is used for digital communications. This system also operates at transmission frequency band between 824 MHz and 849 MHz and is referred to as DMPS 800;
3. the global system for mobile communications ("GSM"), used in Europe and Japan, which specifies a transmission frequency band between 890 MHz to 915 MHz. This digital system is often referred to as GSM 900;
4. the personal communications system ("PCS") 1900, used in North America, which specifies a transmission frequency between 1850 MHz and 1910 MHz;
5. the Nordic mobile telephone 450 system ("NMT-450") which specifies a transmission frequency between 463 MHz and 468 MHz, and uses FDMA (frequency division multiple access) signal modulation; and
6. the Nordic mobile telephone 900 system ("NMY-900") which specifies an FDMA transmission frequency between 935 MHz and 960 MHz.

Other communication standards are also used, and others are certain to appear over time.

The same situation arises with respect to other communication media, such as cordless telephones. In the cordless telephone world, for example, three common standards are:

1. the cordless telephone 2 ("CT2") standard which specifies a transmission frequency between 864 MHz and 868 MHz;
2. the digital European cordless telephone ("DECT") standard which specifies a transmission frequency between 1880 MHz and 1990 MHz; and
3. the newer North American cordless telephones which use the industrial, scientific, medical (ISM) band, transmitting signals at a frequency band of 2475 MHz to 2483.5 MHz.

Demand for cellular telephones and other wireless communications services is continually increasing, as is the pressure to reduce costs and increase marketable advantages such as portability and flexibility. As a result, many wireless systems are now configured to operate in more than one frequency band. However, the current technology results in multi-band and multi-standard wireless handsets and other portable devices which are expensive and bulky, and consume a great deal of power. For cellular telephones and similar consumer items, clearly, it is desirable to that these devices be fully integrated onto inexpensive, low power integrated circuits (ICs).

One of the problems is in the provision of the front end radio-frequency (RF) circuitry, and in particular, in the provision of a "low noise amplifier" (LNA). At the front end of the typical wireless device, signals received from the antenna are first fed to an LNA which amplifies the incoming signal to a level that can be handled by the rest of the receiver circuitry without introducing too much noise or distortion. Such an amplifier must have both a low noise figure and a high gain to reduce the effects of noise in subsequent amplifying and processing stages. Unfortunately, conventional LNAs or wide-band LNAs are unable to provide acceptable noise and gain performance in multiple wireless bands without unduly increasing the amplifier cost and complexity.

Most prior multi-band or multi-standard wireless receivers used separate LNAs for each of the frequency bands, or a single, multi-stage amplifier which is both complex and expensive. In either case, the size, cost and power consumption of the handset is unduly increased.

Figure 1:
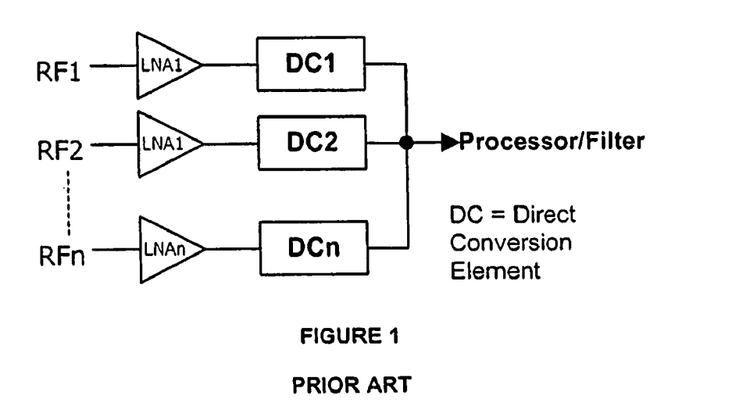
FIG. 1 presents a block diagram of an RF front end, employing a multi-band low noise amplifier topology as known in the art.

For example, a typical front-end for a multi-band, multi-standard RF receiver is presented in the block diagram of FIG. 1. Each of the input RF signals RF1, RF2, . . . RFn, is fed to a corresponding low noise amplifier LNA1, LNA2, . . . LNAn which is optimized for the particular frequency, amplitude and other characteristics of the input signal RF1, RF2, . . . RFn. Each amplified signal is then fed to a direct conversion element DC1, DC2, . . . DCn, or some other manner of signal demodulator, which converts the amplified signal to a lower frequency for processing or filtering. Typically, the RF signals are demodulated to an "intermediate frequency" (IF), or to baseband (the frequency of the original signal. In the case of voice communications, for example, the baseband would be audio frequency).

Clearly, this is an inefficient way of providing a multi-band or multi-standard receiver. The large number of components makes for a physically large, expensive, high power consuming, and unreliable device.

The continuing desire to implement low-cost, power efficient receivers has proven especially challenging as the frequencies of interest in the wireless telecommunications industry (especially low-power cellular/micro-cellular voice/data personal communications systems) have risen above those used previously (approximately 900 MHz) into the spectrum above 1 GHz. Attempts to provide flexible designs in Radio Frequency Integrated Circuits (RFICs)— also known as monolithic microwave integrated circuits (MMICs)—allowing for multiple standards and varying conditions of reception have met with limited success. These designs usually provide this functionality by means of multiple, independent signal paths—one signal path and set of components for each frequency standard and/or set of operating conditions. This is an expensive and physically bulky approach which suffers from all of the performance problems described above.

Thus, there is a need for a simple and inexpensive low-noise amplifier which can operate in at least two distinct frequency bands, addressing the problems above. It is desirable that this design be fully-integratable, inexpensive, physically small, power-efficient, reliable, and high performance. As well, it is desirable that this design be easily applied to multi-standard/multi-frequency wireless applications.

SUMMARY OF THE INVENTION

It is therefore an object of the invention to provide a novel method and system of modulation and demodulation which obviates or mitigates at least one of the disadvantages of the prior art.

One aspect of the invention is defined as a low noise amplifier for a multi-band receiver, comprising: a positive incoming signal amplifier having a first input for receiving a positive RF signal, and a first output for providing an amplified positive RF signal; a negative signal amplifier having a second input for receiving a negative RF signal, and a second output for providing an amplified negative RF signal; and a tunable differential filter having a tuning control input, a third input for said first output and a fourth input for the second output; the frequency response of the tunable differential filter varying with a control signal input to the tuning control input, whereby signal of undesired frequencies may be filtered from the first output and the second output.

BRIEF DESCRIPTION OF THE DRAWINGS

These and other features of the invention will become more apparent from the following description in which reference is made to the appended drawings in which.

DESCRIPTION OF THE INVENTION

Figure 2:
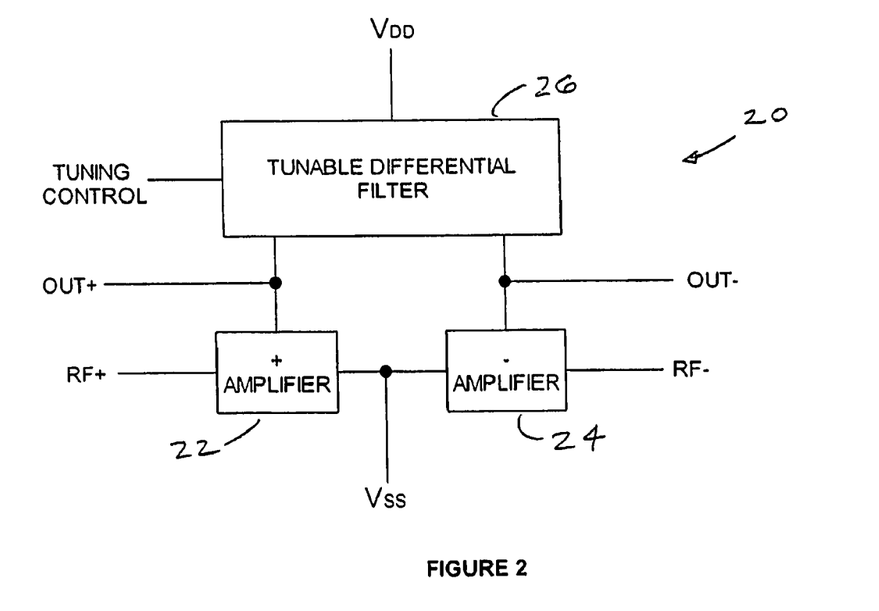
FIG. 2 presents a block diagram of a tunable, differential, low noise amplifier in a broad embodiment of the invention.

A block diagram of a low noise amplifier 20 which addresses a number of the objects outlined above is presented in FIG. 2. This tunable, differential low noise amplifier (LNA) 20 includes two amplifiers 22 and 24, one for the positive signal channel and one for the negative signal channel. The positive amplifier 22, receives an input signal RF+ and produces an amplified output OUT+, while the negative amplifier 24 receives a complementary input signal RF− and produces an amplified output OUT−. The input signals RF+ and RF− will typically originate from an antenna in a wireless application, but may originate from a modem or other device in other applications. The output signals OUT+ and OUT− will typically be fed to some manner of signal demodulator or filter.

The outputs of the two amplifiers 22 and 24 are also tied to a tunable differential filter 26, which is used to tailor the characteristics of the LNA 20. This tunable differential filter 26 is preferably controllable via electronic inputs, such as the tuning control shown in FIG. 2. In the arrangement shown in FIG. 2, the filter provides a high impedance at the desired frequency, and a low impedance at undesired frequencies, which causes out of band signals to be suppressed from the output signals OUT+ and OUT−.

This tunable differential filter 26 could be affected in many ways, a number of which are described hereinafter. Other ways of affecting such functionality would be clear to one skilled in the art from the teachings herein.

Note that the active components of the LNA 20 are powered via $V_{DD}$ and $V_{SS}$ (typically ground).

Figure 3:
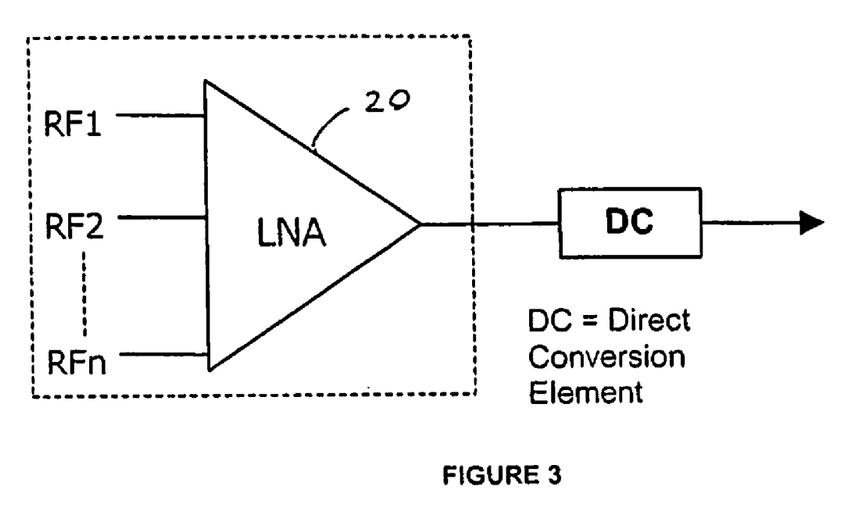
FIG. 3 presents a block diagram of an RF front end, employing a tunable, on-chip, multi-standard LNA in an embodiment of the invention.

The LNA 20 of FIG. 2 could be employed in an RF front end as shown in the block diagram of FIG. 3. Rather than requiring the multiple signal paths as in FIG. 1, this arrangement only requires a single signal path; all of the incoming RF signals RF1, RF2 . . . RFn may be channeled to a single LNA 20. The single output from the LNA 20 is fed to a single direct conversion device DC, which in turn, passes a demodulated signal to some manner of processor or filter.

The RF front end of the invention clearly requires fewer components than that of the prior art. Thus, there are corresponding advantages of smaller size, lower cost, lower power consumption and higher reliability. Because of the differential design, common mode noise (i.e. noise which appears at both the positive and negative connections of either an input or an output) is greatly suppressed. The circuits presented in the preferred embodiments of the invention also provide additional advantages.

DETAILED DESCRIPTION OF PREFERRED EMBODIMENTS OF THE INVENTION

Figure 4:
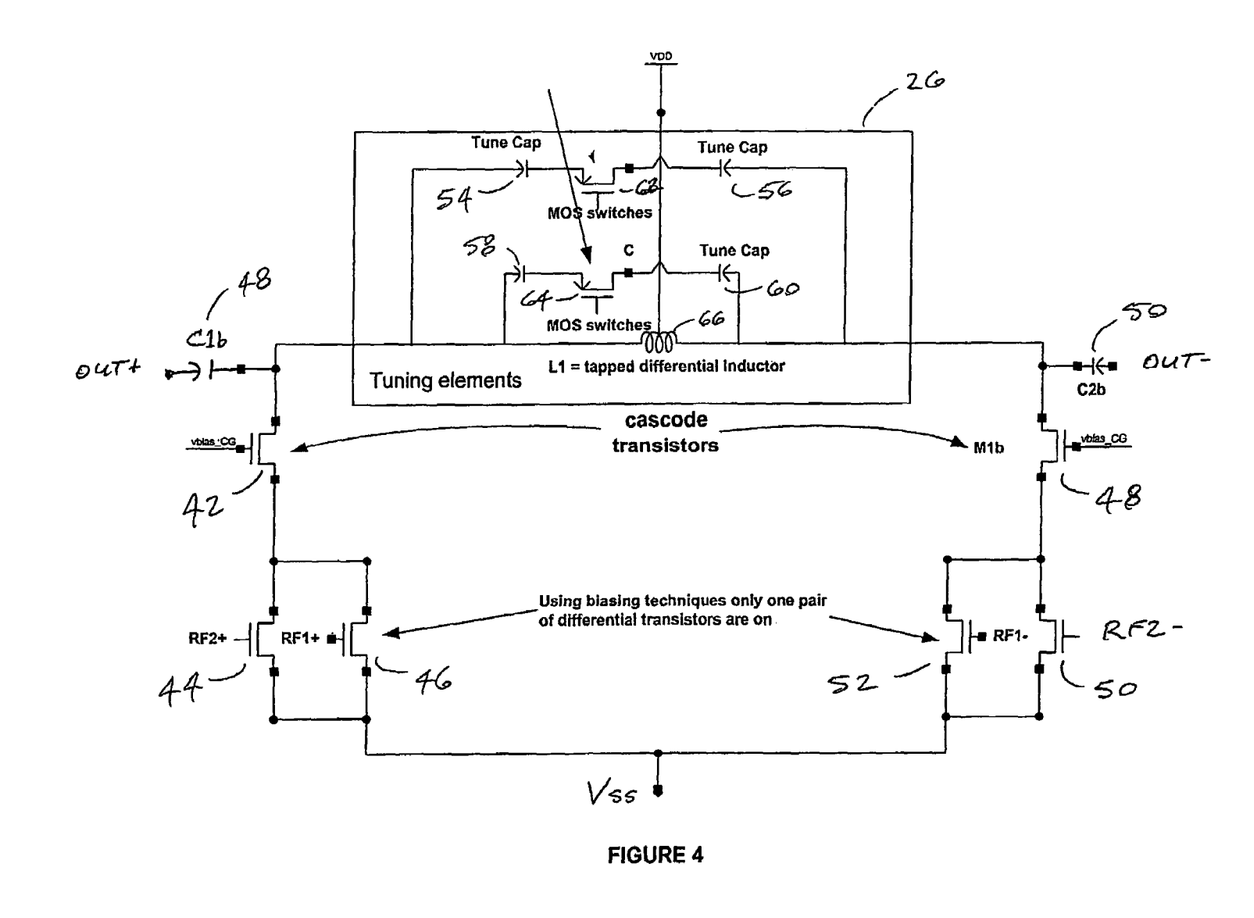
FIG. 4 presents an electrical schematic diagram of a tunable, differential, low noise amplifier in an embodiment of the invention.

FIG. 4 presents a schematic diagram of a tunable, differential, low noise amplifier like that of FIG. 2, except that the following functionality has been added:
  1. gain is adjustable;
  2. multiple and separate RF input signals are optimised;
  3. decoupling capacitors have been added to the outputs; and
  4. switchable circuitry has been presented for the differential, tunable filter.

While this circuit is intended for a two-band application, clearly it can be easily be scaled to a larger number of channels.

In the circuit of FIG. 4, the positive signal amplifier consists of three MOS (metal-oxide silicon) transistors or other semiconductors 42, 44, 46 (p-n-p bipolar junction transistors, field effect transistors or high electron mobility transistors, for example). The vbias_CG input signal is bias the cascode transistor 42. The two RF+ input signals RF1+ and RF2− are fed to the two amplifying transistors 44 and 46. Using separate transistors allows the amplifiers to be tailored to the particular signal characteristics, of input signals RF1+ and RF2+. Other components, of course, could also be added to these amplifier circuits.

A complementary amplifier circuit is used to handle the negative signals, similarly consisting of three transistors or other semiconductors 48, 50, 52. The same vbias_CG input signal noted above, is also used to bias the cascode transistor 48. The two RF-input signals RF1 and RF2 are fed to the two amplifying transistors 50 and 52.

Low frequency noise is blocked from the amplifier outputs by decoupling capacitors 48 and 50.

In this case, the tunable differential filter 26 is effected using two pairs of capacitors 54, 56, 58, 60, two MOS transistors 62, 64, and one centre-tapped inductor 66. The tap on the centre-tapped inductor 66 is connected to the supply voltage VDD and power fed to the two amplifiers 22 and 24 via the two outputs of the centre-tapped inductor 66. The centre-tapped inductor 66 also forms part of a LC (inductor/capacitor) filter in combination with the pairs of capacitors 54, 56, 58, 60. The series pairs of capacitors are switched in and out of the circuit using the two MOS transistors 62, 64 positioned between each pairing of capacitors.

If one of the MOS transistors 62, 64 is in a high impedance state, then the associated circuit will essentially be open, and there will be no capacitance across that particular part of the circuit. Conversely, if one of the MOS transistors 62, 64 is in a low impedance state, then the associated circuit will be closed and the LC filter circuit completed; the tuning frequency would therefore be determined by the capacitors attached to the closed switch and the tapped inductor 66. If C is value of the capacitor associated with the closed switch (note there are two C values on either side of the closed switch) and L is the total inductance of the tapped inductor, then the tuning frequency is related to 1/[2*pi*sqrt([L/2])*C)], assuming infinite Q.

Pairs of capacitors were used to provide symmetry to this differential circuit.

Note that the circuitry of the tunable differential filter 26 causes both the positive and negative channels to be switched at the same time and in a balanced way. This arrangement also avoids problems with parasitic capacitance experienced by other transistor-switched circuits.

Figure 5:
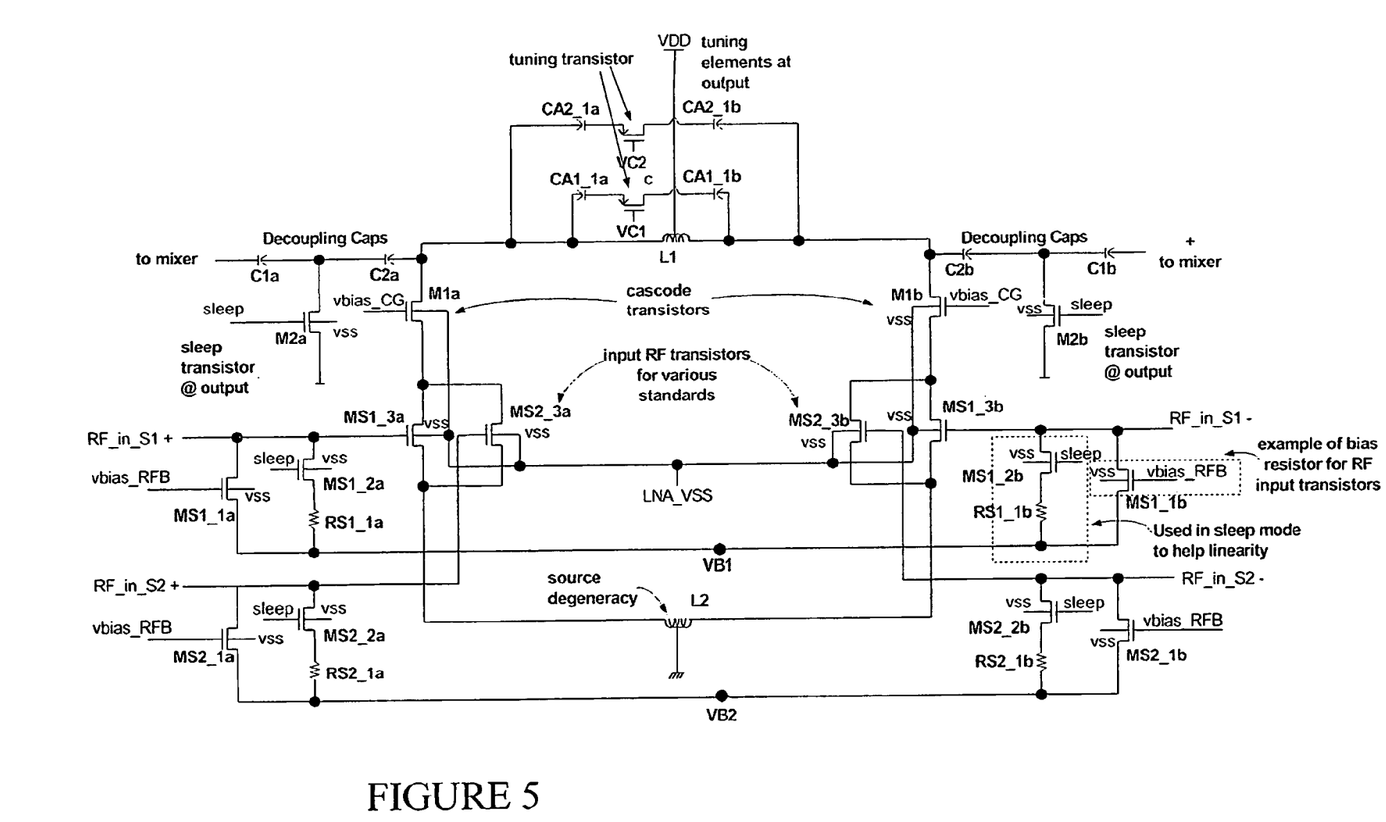
FIG. 5 presents an electrical schematic diagram of a generalized, multi-band, multi-standard low noise amplifier in an embodiment of the invention.

FIG. 5 presents an electrical schematic diagram of a tunable, differential, low noise amplifier like that of FIG. 4, except that the following functionality has been added:
1. "sleep" functionality; and
2. more sophisticated amplification including source degeneracy.

This circuit is presented in a two-band form in the interest of simplicity. Clearly, it can be easily be scaled to a larger number of channels.

The tunable differential filter circuit 26 of FIG. 5 is basically the same as that of FIG. 4, consisting of two pairs of capacitors: a first pair CA2_1a and CA2_1b, and a second pair CA1_1a and CA1_1b. It also includes two MOS transistors VC1 and VC2 for switching the capacitor circuits in and out of the LC filter circuit, and a centre-tapped inductor L1 connected to the supply voltage VDD and feeding power to the two amplifier circuits 22 and 24. As in FIG. 4, if either of the MOS transistors 62, 64 is in a high impedance state, then the associated circuit will essentially be open, and there will be no capacitance across the circuit. Conversely, if one of the MOS transistors 62, 64 is in a low impedance state, then the associated circuit will be closed and the LC filter circuit completed. Pairs of capacitors were used to provide symmetry to this differential circuit.

There are four amplifier circuits in FIG. 5: positive and negative, for each of RF1 and RF2. The negative amplifier for the RF1 signal, consists of a cascode transistor M1b, whose drain is connected to the tunable differential filter circuit 26 and to two series-connected decoupling capacitors C2b and C1b, to the output (decoupling capacitors approximate an open circuit at DC and a short circuit at RF frequencies). The gate of the cascode transistor M1b, is driven by the vbias_CG signal which biases the gate of the cascode transistor. The source of the cascode transistor M1b is connected to the drains of the amplifying transistors MS2_3b and MS1_3b, transistor MS2_3b being used to amplify the RF2-signal, and MS1_3b, being used to amplify the RF1-signal. The sources of both of these transistors are connected to Vss (ground potential) via a center-tapped inductor L2 which serves as source degeneracy for the circuit. A center-tapped inductor is used for L2 to ensure symmetry and balance in the differential circuit. The gate of the amplifying transistor MS2_3b is connected to the RF1-signal source, and also to the drain of an RF blocking transistor MS1_1b which serves as a bias resistor for the amplifier. The gate of this RF blocking transistor MS1_1b is driven by a vbias_RFB signal, and the source is tied to a bias voltage VB1.

Between the two series-connected decoupling capacitors C2b and C1b, the drain of sleep mode transistor M2b is connected. The source of this transistor is tied to ground (Vss), and the gate operated by a sleep signal. When the LNA is to be put into sleep mode, the gates of each of transistors M2b, M2a are driven high, causing any generated signal to pass to ground through the channel resistance of M2b and M2a. This will reduce the gain of the overall amplifier. At the same time, the gates of transistors MS1_2b, MS2_2b, MS1_2a and MS2_2a are also driven high so any input signals are driven across the sleep resistors RS1_1a, RS1_1b, RS2_1a and RS2_1b. to the bias voltage VB1 or VB2. The values of the sleep resistors RS1_1a, RS1_1b, RS2_1a and RS2_1b are chosen to help in linearity of the circuit. Thus, the attenuation in sleep mode can be optimized for each individual standard.

The other four amplifier circuits operate in the same manner, with complementary components. Transistors M1a1/MS1 and M1a2/MS2 are turned on or off depending on what RF signal is required (i.e. either RF1 or RF2). That is:

| Negative Side | Positive Side | Component Functionality |
| --- | --- | --- |
| MS1_1a | MS1_1b | RF blocker using for biasing the input RF transistor for first standard |
| MS1_2a | MS1_2b | Transistor using in sleep mode to increase the linearity for first standard |
| MS1_3a | MS1_3b | Input RF transistor for first standard |
| MS2_1a | MS2_1b | RF blocker using for biasing the input RF transistor for second standard |
| MS2_2a | MS2_2b | Transistor using in sleep mode to increase the linearity for second standard |
| MS2_3a | MS2_3b | Input RF transistor for second standard |
| M1a | M1b | Cascode transistor |
| M2a | M2b | Sleep mode transistor |

The specific values for the components of FIGS. 4 and 5 are selected via the design processors giving a number of specifications (noise figure, linearity, power consumption, standards, gain, blocking requirements). It would be well within the ability of one skilled in the art to make these design decisions given the teachings herein.

Thus, the embodiments of the invention provide the following advantages over typical LNAs and multi-band LNAs:
1. improved noise figure of the LNA;
2. improved noise figure in the presence of a blocker. A blocker is a large signal at a different frequency location than the wanted signal. This signal is referred to as a "blocker" because it will increase the noise floor of the LNA and compress the gain of the LNA so it is more difficult for the desired signal to get through with the correct signal to noise ratio (SNR);
3. has the ability to trade off input matching to linearity. This is a design decision due to the source inductor in FIG. 5. The source inductance can be different for each LNA. If you want more source inductance linearity goes up and the match also gets better;
4. supports "n" standards, scalable from 2 to "n" standards;
5. each standard can be optimized independently for best performance;
6. uses a transistor in the tuning circuit to tune to the required frequency (MS3_4a and MS3_4b)
7. the attenuation in sleep mode can be optimized for each individual standard;
8. the inductor in the tuning circuit and in the source can be designed to be either common or non-common mode;
9. de-coupling caps help to reduce second order distortion of the LNA;
10. the key advantage is that this solution uses a single down conversion technology to down convert all standards (see FIG. 3);
11. the solution is fully integrated;
12. requires less space on an integrated circuit, thereby reducing costs;
13. signal input structure allows several RF inputs at once;
14. all RF signals are combined at the output of the LNA;
15. using transistor in biasing as RF blocker; and
16. trade off between linearity and matching (S11) in sleep mode.

Options and Alternatives

The invention can be implemented in many different ways, with modified or added functionality. For example:
1. the circuit can be single ended opposed to differential;
2. bi-polar transistor (or any other transistors) can be used;
3. bi-polar and MOSFET transistors can be used together in the same circuit;
4. multiple-stage amplifiers could be used; and
5. an array of cascode transistors can be used.

It will be apparent to those skilled in the art that the invention can be extended to cope with more than two or three standards, and to allow for more biasing conditions than those in the above description.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The various preferred implementations in this section are each described in terms of field effect transistors. The implementations are equally advantageous when other technologies are used, including, but not limited to CMOS or Bipolar Junction Transistors. Similarly, suitable fabrication technologies other than Silicon (Si) may be used, including, but not limited to Silicon/Germanium (SiGe), Germanium (Ge), Gallium Arsenide (GaAs), and Silicon on Sapphire (SOS). It is the inventors' intention to protect all such implementations.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signaling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A low noise amplifier for a multi-band receiver, comprising:
   a positive signal amplifier having a first input for receiving a positive RF signal, and a first output for providing an amplified positive RF signal;
   a negative signal amplifier having a second input for receiving a negative RF signal, and a second output for providing an amplified negative RF signal; and
   a tunable differential filter having a tuning control input, a third input for said first output and a fourth input for said second output the tunable differential filter including a centre-tapped inductor connected between the first output and the second output;
   the frequency response of said tunable differential filter varying with a control signal input to said tuning control input, whereby signal of undesired frequencies may be filtered from said first output and said second output.

2. The low noise amplifier of claim 1, wherein said tunable differential filter comprises a capacitor/inductor filter.

3. The low noise amplifier of claim 1, wherein said positive and negative signal amplifiers include source degeneracy.

4. The low noise amplifier of claim 1, further comprising a sleep circuit.

5. The low noise amplifier of claim 1, further comprising RF blocking transistors.

6. The low noise amplifier of claim 1, wherein said positive and negative signal amplifiers comprise single amplification stages comprising a single transistor.

7. The low noise amplifier of claim 1, wherein said tunable differential filter comprises two or more capacitor/inductor filters, switched in and out of said circuit using transistors.

8. The low noise amplifier of claim 1, wherein said tunable differential filter comprises: two or more pairs of capacitors, each pair of capacitors being arranged in series, one end of said series connected to said third input and the other end of said series connected to said fourth input; and a signal centre-tapped inductor, the centre tap connect to supply voltage potential, one end of said inductor connected to said third input and the other end of said conductor connected to said fourth input.

9. The low noise amplifier of claim 7, wherein said tunable differential filter comprises a transistor in series with each of said two or more pairs of capacitors, each transistor being positioned between its associated pair of capacitors, whereby each the circuit for each pair of capacitors can be opened or closed.

10. The low noise amplifier of claim 1 wherein each of said amplifiers comprises a transistor.

11. The low noise amplifier of claim 1 wherein each of said amplifiers comprises a field effect transistor (FET).

12. The low noise amplifier of claim 1 wherein said tunable differential filter is tuned for a transmit band of a cellular communication system.

13. The low noise amplifier of claim 1 wherein a separate amplifier is used for each band and/or standard, whereby each separate amplifier may be optimised for the particular band and/or standard that it is to amplify.

14. The low noise amplifier of claim 1, further including decoupling capacitors to reduce second order distortion.

15. The low noise amplifier of claim 1 wherein said low noise amplifier is fully integrated.

16. A low noise amplifier for a multi-band receiver, comprising:
- a positive signal amplifier having a first input for receiving a positive RF signal, and a first output for providing an amplified positive RF signal;
- a negative signal amplifier having a second input for receiving a negative RF signal, and a second output for providing an amplified negative RF signal; and
- a tunable differential filter having a tuning control input, a third input for said first output and a fourth input for said second output, the tunable differential filter including two or more pairs of capacitors where each pair of capacitors are arranged in series, one end of said series being
- connected to said third input and the other end of said series being connected to said fourth input, the tunable differential filter further including a signal centre-tapped inductor, the centre tap being connected to a supply voltage potential, one end of said inductor connected to said third input and the other end of said conductor connected to said fourth input;
- the frequency response of said tunable differential filter varying with a control signal input to said tuning control input, whereby signal of undesired frequencies may be filtered from said first output and said second output.

17. A low noise amplifier for a multi-band receiver, comprising:
- a positive signal amplifier having a first input for receiving a positive RF signal, and a first output for providing an amplified positive RF signal;
- a negative signal amplifier having a second input for receiving a negative RF signal, and a second output for providing an amplified negative RF signal; and
- a tunable differential filter having a tuning control input, a third input for said first output and a fourth input for said second output, the tunable differential filter including two or more capacitor/inductor filters switched in and out of said circuit using transistors, and a transistor in series with each of said two or more pairs of capacitors, each said transistor being positioned between its associated pair of capacitors, whereby each circuit for each pair of capacitors can be opened or closed;
- the frequency response of said tunable differential filter varying with a control signal input to said tuning control input, whereby signal of undesired frequencies may be filtered from said first output and said second output.

* * * * *